US007718326B2

(12) United States Patent
Stenger

(10) Patent No.: US 7,718,326 B2
(45) Date of Patent: May 18, 2010

(54) SEAMLESS STITCHING OF PATTERNS FORMED BY INTERFERENCE LITHOGRAPHY

(76) Inventor: Vincent E Stenger, 6626 Fountains Blvd #11, West Chester, OH (US) 45069

( * ) Notice: Subject to any disclaimer, the term of this patent is extended or adjusted under 35 U.S.C. 154(b) by 804 days.

(21) Appl. No.: 11/454,274

(22) Filed: Jun. 17, 2006

(65) Prior Publication Data

US 2007/0023692 A1    Feb. 1, 2007

Related U.S. Application Data

(60) Provisional application No. 60/691,158, filed on Jun. 17, 2005.

(51) Int. Cl.
*G03F 9/00* (2006.01)
(52) U.S. Cl. ............... 430/22; 430/30; 430/394
(58) Field of Classification Search .............. 430/5, 430/396, 22, 30, 394, 311; 250/492.2
See application file for complete search history.

(56) References Cited

U.S. PATENT DOCUMENTS

| 5,142,385 | A |   | 8/1992  | Anderson et al. |
|-----------|---|---|---------|-----------------|
| 5,216,257 | A |   | 6/1993  | Brueck et al.   |
| 5,343,292 | A |   | 8/1994  | Brueck et al.   |
| 5,437,946 | A | * | 8/1995  | McCoy ............ 430/5 |
| 5,597,613 | A |   | 1/1997  | Galarneau et al.|
| 5,674,652 | A |   | 10/1997 | Bishop et al.   |
| 6,185,019 | B1|   | 2/2001  | Hobbs et al.    |
| 6,225,038 | B1|   | 5/2001  | Smith et al.    |
| 6,285,817 | B1|   | 9/2001  | Hobbs           |
| 6,337,162 | B1| * | 1/2002  | Irie ............ 430/5 |
| 6,522,433 | B2|   | 2/2003  | Kelsey et al.   |
| 6,556,280 | B1|   | 4/2003  | Kelsey et al.   |
| 6,882,477 | B1|   | 4/2005  | Schattenburg et al. |
| 6,958,207 | B1|   | 10/2005 | Khusnatdinov et al. |
| 2001/0035991 | A1 |   | 11/2001 | Hobbs et al. |
| 2001/0055733 | A1 | * | 12/2001 | Irie et al. ........ 430/396 |
| 2002/0168295 | A1 |   | 11/2002 | Cunningham et al. |

(Continued)

OTHER PUBLICATIONS

Apostol, A.D. et al., "2D Multiple Beam Interface Lithography," National Institute for Laser, Plasma and Radiation Physics and National Institute of Microtechnology, Romania, pp. 151-154.

(Continued)

*Primary Examiner*—Stephen Rosasco
*Assistant Examiner*—Stewart A Fraser
(74) *Attorney, Agent, or Firm*—Frost Brown Todd LLC

(57) ABSTRACT

This invention addresses the scalability problem of periodic "nanostructured" surface treatments such as those formed by interference lithography. A novel but simple method is described that achieves seamless stitching of nanostructure surface textures at the pattern exposure level. The described tiling approach will enable scaling up of coherent nanostructured surfaces to arbitrary area sizes. Such a large form factor nanotechnology will be essential for fabricating large aperture, coherent diffractive elements. Other applications include high performance, antiglare/antireflection and smudge resistant Motheye treatments for display products such as PDA's, laptop computers, large screen TV's, cockpit canopies, instrument panels, missile and targeting domes, and, more recently, "negative-index" surfaces. Although ideal for seamless stitching of nanometer scale patterns, the technology is broadly applicable to any situation where an arbitrarily large area needs to be seamlessly tiled with a smaller base pattern that has periodic overlap able boundaries.

19 Claims, 14 Drawing Sheets

U.S. PATENT DOCUMENTS

2003/0002156 A1    1/2003  Hobbs et al.
2003/0210396 A1   11/2003  Hobbs et al.

OTHER PUBLICATIONS

Babu, S.V. et al., "Calculation of image profiles for contrast enhanced lithography," J. Vac. Sci. Technol. B, vol. 6(2) (Mar./Apr. 1988) pp. 564,568.

Babu, S.V. et al., "Exact Solution for the Kinetics of the Image Reversal Process," IEEE Electron Device Letters, vol. EDL-7(4) (Apr. 1986) pp. 250-251.

Barnier, F. et al., "Assessment of phase mask stitch errors by the Moiré technique," Optics Communications, vol. 162 (1999) pp. 299-305.

Brettmann, B., "Self-Assembly of Nanofabricated Colloids," NNIN REV Research Accomplishments (2005) pp. 6-7.

Brueck, S.R.J., "Optical and Interferometric Lithography-Nanotechnology Enablers," Proceedings of the IEEE, vol. 93(10) (Oct. 2005) pp. 1704-1721.

Brueck, S.R.J., "There are NO Fundamental Limits to Optical Nanolithography," IEEE (Aug. 2004) pp. 63-64.

Chen, T.T. et al., "Grating Fabrication by Interference of Laser Beams," Chinese Journal of Physics, vol. 15(1) (Spring 1977) pp. 1-4.

Chen, C.G. et al., "Image metrology and system controls for scanning beam interference lithography," J. Vac. Sci. Technol. B, vol. 19(6) (Nov./Dec. 2001) pp. 2335-2341.

Chuang, W.C. et al., "Fabrication of a high-resolution periodical structure using a replication process," Optics Express, vol. 13(18) (Sep. 5, 2005) pp. 1-8.

Cordeiro et al., "Measurement of phase differences between the diffracted orders of deep relief gratings," Optics Letters, vol. 28(9) (May 1, 2003) pp. 683-685.

Diamond, J.J. et al., "Simple Algebraic Description of Photoresist Exposure and Contrast Enhancement," IEEE Electron Device Letters, vol. EDL-7(6) (Jun. 1986) pp. 383-386.

Dill, F.H., "Characterization of Positive Photoresist," IEEE Transactions on Electron Devices, vol. ED-22(7) (Jul. 1975) pp. 445-452.

Flack, W.W. et al., "Contrast Enhancement Materials for Thick Photoresist Applications," Proceedings of SPIE, vol. 5376, Advances in Resist Technology and Processing XXI (May 2004) pp. 1190-1205.

Flack, W.W. et al., "Lithographic Manufacturing Techniques for Wafer Scale," IEEE (May 1992) pp. 4-13.

Freschi, A.A. et al., "Phase-controlled photorefractive running holograms," Optical Communications, vol. 143 (Nov. 15, 1997) pp. 257-260.

Freschi, A.A. et al., "Phase-locking of superimposed diffractive gratings in photoresists," Optics Communications, vol. 208 (2002) pp. 41-49.

Freschi, A.A. et al., "Strong and fast phase modulation for quantitative analysis of photorefractive gratings," Appl. Phys. B., vol. 83 (2006) pp. 279-284.

Gamet, E. et al., "Flying phase mask for the printing of long submicron-period stitchingless gratings," Microelectric Engineering, vol. 83 (2006) pp. 734-737.

Hobbs, D.S. et al., "Design, Fabrication, and Measured Performance of Anti-Reflecting Surface Textures in Infrared Transmitting Materials," Proceedings of SPIE, vol. 5786 (May 2005) pp. 349-364.

Hobbs, D.S. et al., "Update on the Development of High Performance Anti-Reflecting Surface Relief Micro-Structures," Proc. of SPIE, vol. 6545 (2007) pp. 1-14.

Jeong, J.H. et al., "UV-nanoimprint lithography using an elementwise patterned stamp," Microelectric Engineering, vol. 75(2004) pp. 165-171.

Klosner, M. et al., "Massively parallel, large-area maskless lithography," Applied Physics Letters, vol. 84(15) (Apr. 12, 2004) pp. 2880-2882.

Koops, H.W.P. et al., "Combined lithographies for the reduction of stitching errors in lithography," J. Vac. Sci. Technol. B. , vol. 12(6) (Nov./Dec. 1994) pp. 3265-3269.

Macintyre, D.S. et al., "Nanometre scale overlay and stitch metrology using an optical microscope," Microelectric Engineering, vol. 83 (2006) pp. 1051-1054.

Rumpf, R. et al., "Modeling the fabrication of nano-optical structures," College of Optics, U. of Central Florida, pp. 1-14.

Schattenburg, M.L. et al., "Progress towards a general grating patterning technology using phase-locked scanning beams," Proceedings of the SPIE, vol. 4485 (Jul. 30, 2001) pp. 1-7.

Scott, S., "Large Area Microstructured Optic Applications," Reflexite Precision Technology Center, pp. 1-3.

Wang, W.C., "Moiré Method," University of Washington, pp. 1-73.

Zaidi, S.H. et al., "Moiré interferometric alignment and overlay techniques," SPIE, vol. 2196 (Mar. 1994) pp. 371-382.

Zaidi, S.H. et al., "Multiple-exposure interferometric lithography," J. Vac. Sci. Technol. B, vol. 11(3) (May/Jun. 1993) pp. 658-666.

\* cited by examiner

SEAMLESS STITCHING OF PATTERNS FORMED BY INTERFERENCE LITHOGRAPHY

This application claims the benefit of provisional patent application No. 60/691,158 file date Jun. 17, 2005

TECHNICAL FIELD OF THE INVENTION

This invention pertains directly to the field of interference lithography and nanotechnology. However, the invention can be applied to any situation where a large area needs to be seamlessly tiled with a smaller base pattern by any of a multitude of pattern exposure or impression mechanisms.

BACKGROUND OF THE INVENTION

Nano structured and micro structured surfaces have been investigated for many years in terms of the special functional properties that can be achieved. For example, surfaces made up of many small "protuberances", such as closely and regularly spaced cones, at the micron or sub-micron scale, can exhibit self-cleaning as well as near omni-directional and polarization insensitive anti-reflective properties at optical wavelengths. When features are on the nanometer scale, such so-called "Motheye" nanotextured surface treatments can be ideal anti-glare treatments for display applications. The anti-glare properties can be superior to any other bulk or multi-layered material film approach. A number of examples of such nanometer scale structures or "nanotextures" are illustrated in FIG. 1a. The linear 2-D relief grating is typically used for Bragg grating applications. This particular one was used to realize tight 90 degree bends in integrated optic wave guides[1]. The negative index structure has the potential for realizing flat lenses, and is currently a popular research topic[2]. The "Motheye" and SWS ("Subwavelength structures") are both used for anti-reflective applications[3], with Motheye being a much more broadband treatment[4]. The "black hole" structure is used for light trapping applications, but could also be used as a highly efficient field emitter array, such as for backlight or plasma display applications.

Currently, such nanometer scale periodic structures are typically created by using optical beam interference lithography. The issue now is that useful coherent pattern sizes are typically limited to a few inches, creating a barrier to commercial application of these nanotechnologies. What is needed now is a readily scalable coherent nanotextured surface treatment technology. Such a technology could be immediately used in Motheye anti-glare and smudge resistant treatments for the plethora of display devices and windows available in the consumer and industrial markets. These include but are not limited to personal digital assistants, cell phones, portable game devices, laptop computer displays, television screens, and automobile and store-front windows.

An approach to realizing larger form factor nanotextured surfaces at the exposure level can be considered. One series of inventions taught by Hobbes[5] and Kelsey, et al.[6] describe the use of optical fiber delivery of the exposure beams to increase the coherent interference pattern size and uniformity in the far field recording (exposure) plane. It can be surmised that due to the divergence of the optical beam from an optical fiber, larger pattern size could be achieved by simply increasing the distance between the optical fiber tip and the exposure region. However, this has practical limitations, as larger distances will incur more pointing and vibration sensitivity, as well as wave front phase randomization, all of which will tend to wash out the developed exposure pattern. The other issue is that the exposure intensity is reduced rapidly in a square law sense as the distance is increased, leading to increased exposure times. As an example, an increase in diameter coverage by a factor two incurs an exposure time increase of a factor four. Longer exposure times lead to more washing out of the interference pattern exposure due to vibrations, mechanical, and other drifts.

Another approach to realizing large area micro and nano textured surfaces has been to mechanically stitch together the nanotextured surfaces, either at the master stamp level shown in FIG. 2, or at the product level as shown in FIG. 3. At the master level, many smaller sub-master stamps are bonded together to form a larger master stamp. At the product level, a single smaller master is used to "stamp and repeat" a product film or substrate to cover a larger area. Although there may be some exceptions for certain applications, the vast majority of display applications would require perfect (seamless) stitching, as the human eye is very capable of discerning stitch errors at the microscopic scale. This is due mostly to discontinuous phase boundaries and stitch related defects. Due to practical tolerance issues, such mechanical tiling inherently results in large stitching errors in all 3 dimensions (x, y, and z) when applied to micro and nanometer scale textures. At best, such errors would result in cosmetic and performance reduction in display anti-glare treatments. At worst, such errors make these mechanical approaches completely useless for large area coherent diffraction elements.

A third approach to scaling up these nanotextures combines the optical and mechanical approaches. This approach stitches or otherwise blends together many smaller uniform patterns at the exposure phase to create a larger area coherent pattern. This has been achieved to some degree by researchers at MIT, using what they call "scanning beam interference lithography"[7]. In that patented work[8], large area linear grating patterns were reportedly achieved by scanning the position of a photoresist coated substrate under the fluence of two interfering 1 to 2 mm diameter Gaussian beams. The smaller base interference pattern was thus a simple linear fringe pattern. Positioning of the substrate was reportedly kept on track by feedback from a highly sophisticated optical metrology apparatus. Reportedly, there was some success in fabricating linear gratings (arrays of 400 nm spaced lines) on 300 mm diameter wafers[9]. However, the apparatus was quite complex, as can be discerned from the lengthy 99 page patent document. This was likely because position control and grating coherence relied on feedback from a fixed reference "fiducial" grating as opposed to locking on to actual previous exposures. Any drift in the fiducial during the scanning process would result in stitch error. Also, note that the 1 mm exposure size would result in very slow process times for large area coverage. Finally, although the 400 nm spacing may be suitable for near infrared applications, it is not sufficient for the less than 200 nm feature sizes required for visible (e.g. display) applications. Also, as the method taught is a scanning approach, it is not amenable to larger area stamp and repeat coherent coverage of more complex 3-D nanotexture patterns, such as Motheye.

McCoy teaches a stitching related invention in a 1995 patent that addresses the intensity profile needed in the tile overlap regions to ensure an overall uniform dosage[10]. This somewhat obvious method of achieving spatially uniform dosage has also been used by Schattenburg, et al. in their scanning beam interference lithography invention[8]. There is no reference in McCoy's invention as to how the fine structures of the base pattern would be stitched or mesh aligned. To date, there has been no report of a method by which to perform seamless stitch tiling of nanometer scale patterns to large areas.

SUMMARY OF THE INVENTION

This patent disclosure describes several approaches to implementation of optical feedback and positioning for stitch alignment of nanometer and micrometer scale patterns formed by methods such as interference lithography. Due to the regularity and periodicity of the step-and-repeat tiled patterns at their boundaries, adjacent exposures can be stitch aligned by observing the pattern optical transmissions, or other suitable signals, in the pattern overlap regions. In this fashion, each new exposure is locked onto a previous exposure. Such stitch tiling can be extended to cover arbitrarily large areas with a smaller base pattern. In an exemplary embodiment of the disclosed invention, the bleaching effect of photoresist or other photosensitive layer or layers is exploited to form a stitch alignment transmission mask for each new pattern exposure. In another embodiment, a special registration layer serves for alignment of each new exposure pattern to a previously exposed pattern. For interference lithography, in addition to a conventional piezo based, or other hi resolution mechanical positioning method, a high speed optical modulation method is taught which can be used for fine stitch alignment of the base pattern once it is roughly positioned by mechanical, or other means.

BRIEF DESCRIPTION OF THE DRAWINGS

For a more complete understanding of the present invention and its advantages, reference is now made to the following description taken in conjunction with the accompanying figures in which like reference numbers indicate like features and wherein.

DETAILED DESCRIPTION OF THE INVENTION

Figure 4:
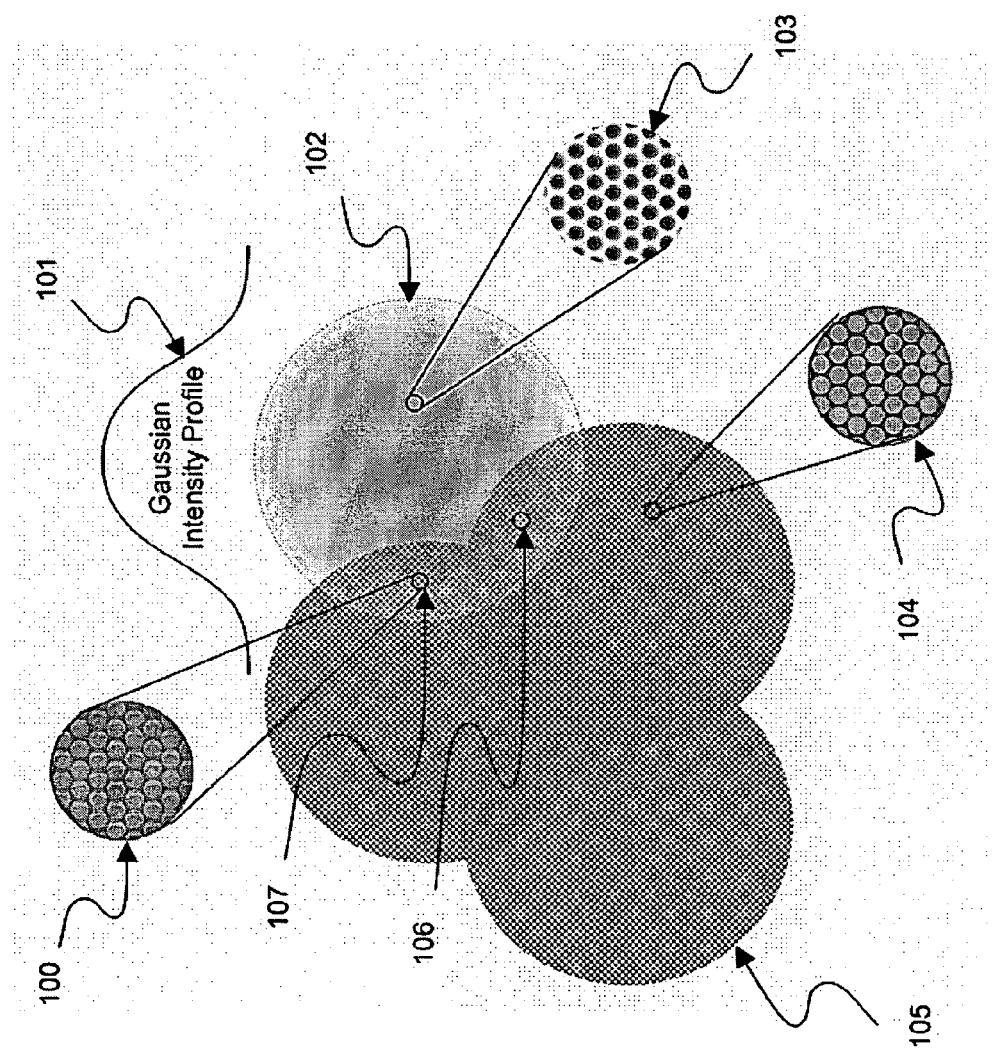
FIG. 4 is an illustration of an exemplary embodiment of the present invention as applied to overlap tiling and stitching of circular, Gaussian profile exposure patterns that comprise fine periodic features on the nanometer scale.

The current invention pertains to a novel, simple, and cost effective method to seamlessly tile and stitch regular surface textures, such as those with periodic nanometer scale features, at the exposure level of the fabrication process. An example of exposure level tile stitching of patterns in accordance with an exemplary embodiment of the present invention is shown in FIG. 4. Exposure pattern 102 may be generated by any of a number of ways, such as through interference by a plurality of monochromatic beams. Post exposures 105 represent impression of base pattern 102 at a plurality of partially overlapping tiled positions. The impression is manifested in the form of a transmission mask, or some other permanent or semi-permanent effect in the surface being exposed that can be used to register the post exposure pattern fine position relative to the new exposure pattern 102 position. Corresponding zoom view details are shown for base pattern 103 and for post-exposures 104, and for an overlap region 100. Here, due to the fine feature regularity of the base pattern 103, the pre-exposure pattern 102 can be seamlessly tiled by overlapping and meshing with post-exposure patterns 105 through some form of alignment error feedback signal. It is this alignment between base exposure pattern 102 and post-exposures 105 in the overlap regions such as 107 and 106 which represents the essence of the present invention. That is, that the new exposures are aligned directly with previous exposures. According to previous disclosures[10,8], the overall exposure pattern intensity profile is modified at the boundaries where stitching overlap occurs so as to ensure a more spatially uniform exposure dosage. In the figure, a Gaussian profile 101 is used as an example. This is the default profile for a free space beam of radiation, and also results in a highly regular wave front both in phase and in intensity. Stitched pattern exposure separations are appropriately chosen to yield the most spatially uniform dosage profile. To mesh perfectly (no stitch error), some form of alignment feedback must be implemented for the overlapping region between pre and post exposures. Also, positioning of the pattern at the nanometer scale must be implemented. A number of embodiments for the feedback are emphasized in this disclosure. In the specific case where patterns are formed through interference lithography, an alignment positioning invention by exposure beam differential phase control is also described.

1. Alignment Feedback via Self-Generated Transmission Mask (Self Masking)

For most photosensitive materials used in lithography, the absorption of the photo-resist undergoes a permanent change after exposure. In positive photo-resist, this is called "bleaching" and can result in a much higher photo-resist optical transmission after exposure. The exposed pattern itself can thus serve as a pattern overlap alignment mask for an adjacent exposure light pattern. When the new exposure pattern is aligned to the previous exposure (mask), it will show up as a strong transmitted light signal in the pattern overlap region. It then becomes simply a matter of positioning the substrate and/or pattern to maximize this transmitted light in order to seamlessly "stitch" align the adjacent pre-exposure pattern with the already post exposed pattern. Applying this to the illustration of FIG. 4, one can see that the lighter features in the post exposure zoom view 104 represent windows of higher optical transmission. In the overlap alignment region such as in the zoom view 100, one can see that maximum transmission of the exposure pattern 102 will occur when it is aligned with the exposed features of the post exposure pattern.

Figure 5:
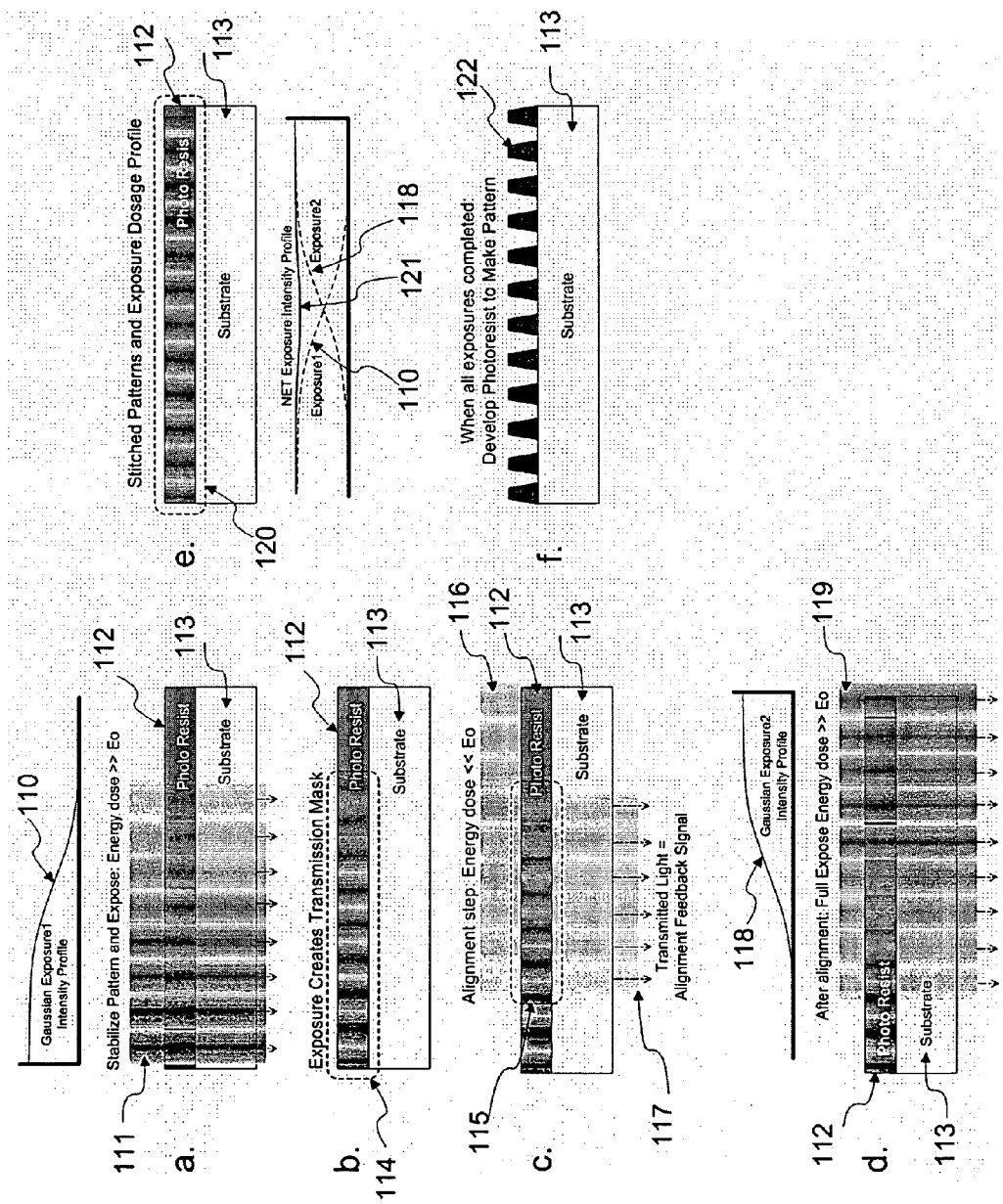
FIG. 5 illustrates the self masking mechanism in accordance with an exemplary embodiment of the present invention as applied to exposure level stitching of patterns in a medium to high contrast photosensitive layer or layers.

FIG. 5 is an illustration detailing an exemplary embodiment of stitch alignment feedback in the present invention. In this embodiment, each full exposure 111 and 119 inherently creates a transmission alignment mask via the photo-bleaching properties of the photosensitive layer or layers. An appropriate photo-resist layer (or layers) 112 is applied to a suitably optically transparent substrate 113. After exposure of the base tile pattern 111 to create transmission mask 114 in the photoresist 112, adjacent tiled pre-exposure patterns 116 are roughly positioned to partially overlap the previous exposure in region 115 in such a way that the eventual total exposure dosage will be uniform across both exposure patterns. During this coarse positioning, the pre-exposure pattern 116 can be significantly reduced in dosage (E<<Eo) relative to the full exposure (E>>Eo) case, so as not to prematurely bleach, or otherwise expose the photoresist 112 until the alignment condition has been achieved. Adjusting this pre-exposure pattern 116 fine position and maximizing the transmitted signal 117 from the pattern overlap region 115 signifies the alignment condition, and a full exposure 119 is applied. Note that dosage, in the context of this invention disclosure, refers to any combination of average exposure energy, intensity, and time of the exposure pattern.

Any pre-exposure effects can be further reduced by using high contrast photoresists or contrast enhancement layers. That is, there is a sharp non-linear increase in photoresist exposure after a certain threshold exposure dosage Eo is reached. Any integrated exposure or dosage below this value has negligible effect on the final developed pattern. Hereinafter, this, or other variations of this alignment feedback scheme, are referred to as "self-masking" stitch alignment. Once stitch alignments and exposures are completed, a plurality of seamlessly tiled patterns are thus impressed in a uniform dosage 120 in the photoresist 112. This uniformity of dosage 141 stems from the use of graded intensity exposure patterns 130 and 139. The exposed photoresist layer or layers 112 can then be further processed by development techniques to yield the textured surface 122. In many cases, the follow-up process will involve using this developed pattern as an etch mask to transfer the pattern to the substrate 113.

Although the embodiments described thus far represent application of the invention to more two-dimensional nanometer scale surface textures, the self-masking described in the present invention may be applied to stitching of more general three dimensional patterns with periodic boundaries, such as those that could be formed by holography, without violating the spirit of the invention. Such exposure schemes can be used to create three-dimensional photonic band gap structures. For example, interference lithography could be used to create a three-dimensional nanometer scale periodic exposure pattern in a thick layer or volume of photosensitive material. In one embodiment of the stitch alignment invention, overlap region transmission of adjacent 3-D exposures would again be used as the alignment signal. X, Y, and Z (as needed) would be adjusted to maximize the transmitted signal and achieve stitch alignment.

Although the embodiment described thus far specifies transmission of the overlap signal through a suitably transparent substrate, it will be obvious to those skilled in the art that, given a suitably reflecting substrate, the reflected light pattern will also correlate with the stitch alignment error magnitude. This modification, and others like it, does not violate the spirit of this invention.

2. Self-Masking Alignment Feedback with Commercial Photoresists

A. Photosensitive Layer Selection

Commercial photoresists typically undergo changes in absorption coefficient due to bleaching during and after exposure. This "contrast" in absorption before and after exposure shows up in the so called "Dill" parameters for the resist, so named after the researcher that defined them in a landmark 1975 paper[11]. The complete set of Dill parameters, along with typical units are:

$$A = \frac{1}{d}\text{Log}\left[\frac{T(\infty)}{T(0)}\right] \; (\mu m^{-1}) \quad (1)$$

$$B = -\frac{1}{d}\text{Log}[T(\infty)] \; (\mu m - 1) \quad (2)$$

$$C = \frac{A+B}{AI_0T(0)\{1-T(0)\}}\frac{dT(0)}{dt} \; (mJ/cm^2)^{-1} \quad (3)$$

As can be seen, the "A" parameter is a direct measure of the contrast, or change in transmission before and after exposure, while "B" represents the transparency (bleaching amount) after full exposure. Multiplying A by the film thickness will give the Log ratio change in transmission after exposure. Values of A for high contrast resists are between 1 and 2, which means the transmission of 1 µm unexposed films can be from 1/10 to 1/100 that of exposed films. As an example, Clariant AZ® HiR™ series i-line photoresist publishes a "k" absorbing value of refractive index change from 0.031 before exposure to 0.0009 after exposure to 405 nm light. Using $$T = e^{-2\alpha \cdot d} = e^{-\frac{4\pi}{\lambda}k \cdot d} \quad (4)$$

and λ=405 nm, d=film thickness=0.5 µm or 500 nm, then optical power transmission (T) will change from 62% before exposure, to 99% after exposure (not including Fresnel reflection loss of about 6% per air/resist interface for this particular resist). Such a change in transmission clearly can be used as an alignment signal.

B. The Alignment Time Window

Figure 6:
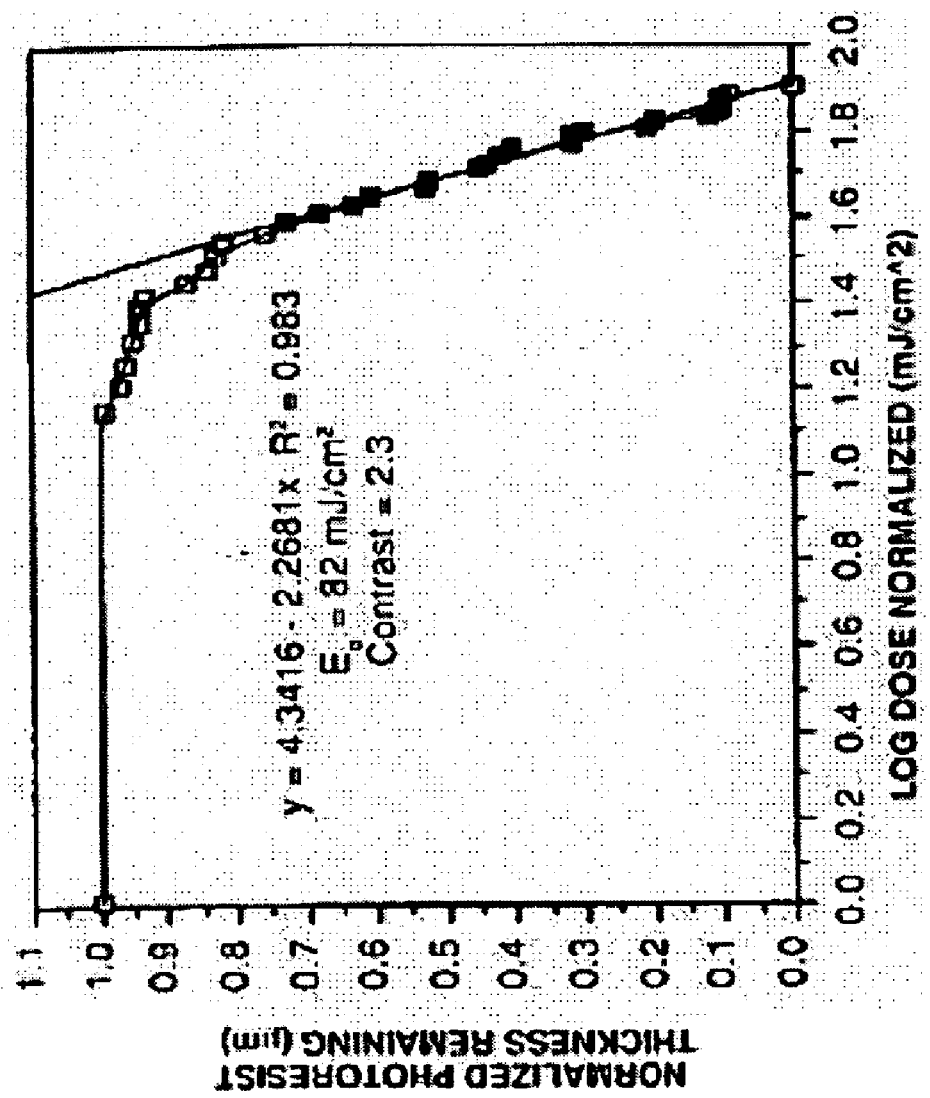
FIG. 6 is a graphical representation of the response behavior of a typical photosensitive material (photoresist) to exposure dosage.

High contrast photoresists are typified by the response shown in FIG. 6. In this example of the popular Shipley™ 1800 series photoresist, there is a very clear threshold behavior of developed resist versus exposure dose (combination of exposure energy, intensity, and time). It is this threshold behavior signified by Eo and related contrast parameter for the resist that affords the time needed to perform the alignment step. During the stitch alignment steps, as long as net exposure dosage is kept well below the Eo threshold, there will be no significant photoresist removal during the development step. It is only after the stitch alignment is locked that the dosage is increased to achieve full exposure and subsequent development.

C. Contrast Enhancement Films

Figure 1:
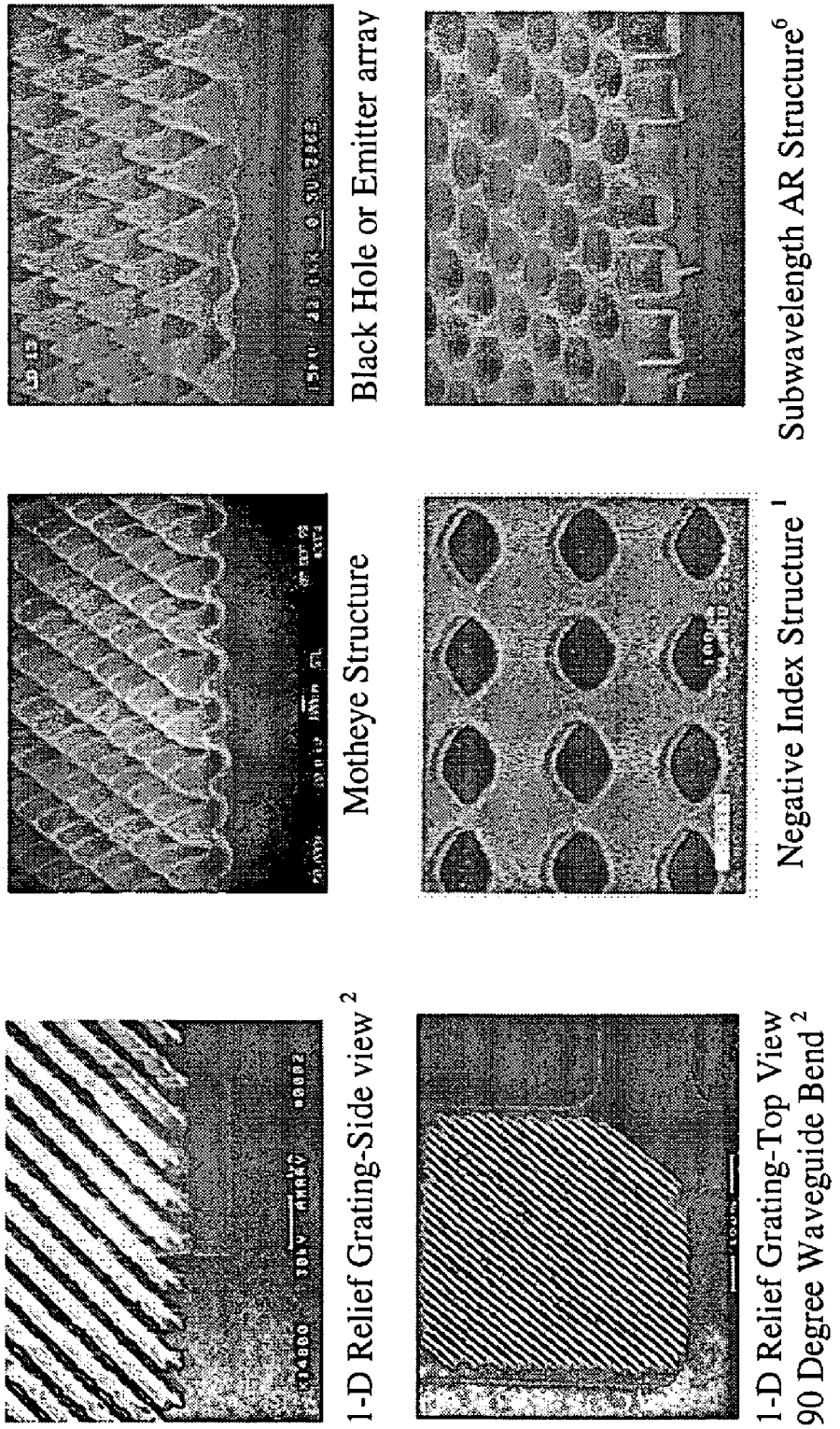
FIG. 1 is a collection of high resolution photos of example nanometer and micrometer scale periodic structures that may scale to large coherent areas through application of the present invention.
Figure 2:
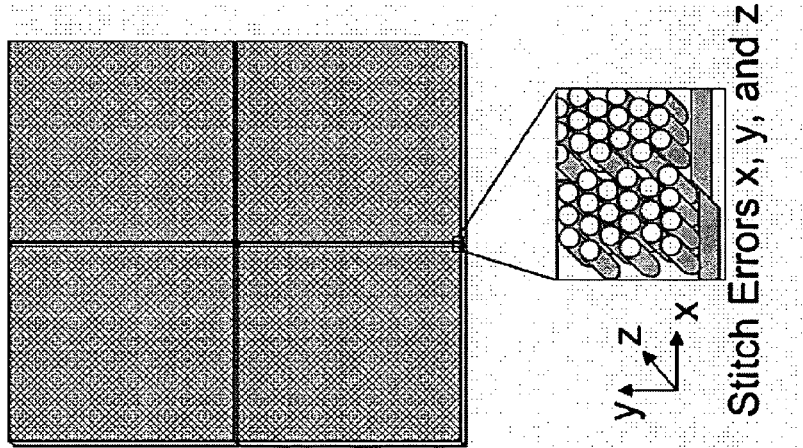
FIG. 2 is an illustration of generating a larger master stamp by tile stitching of smaller stamps by mechanical means, with details of the inherent stitch errors.
Figure 3:
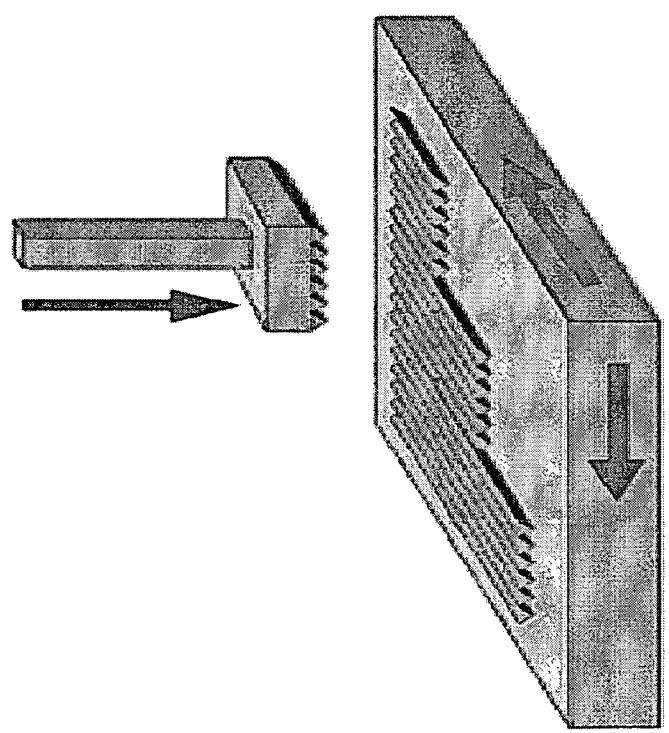
FIG. 3 is a pictorial representation of a mechanical stamp and repeat tiling scheme or stitching at the product fabrication level.
Figure 7:
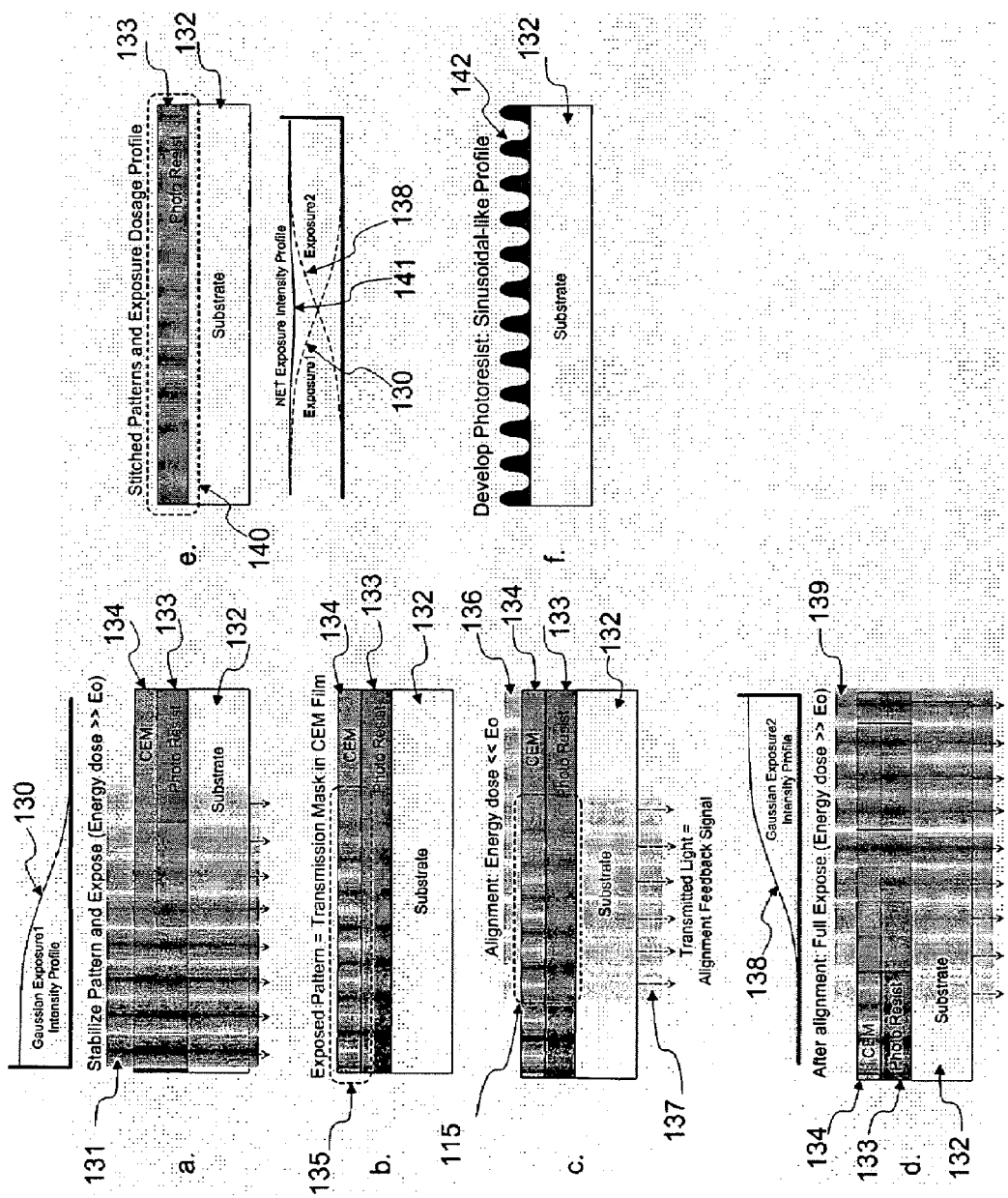
FIG. 7 illustrates the use of contrast enhancing material layer or layers in the self masking mechanism in accordance with a modification of an exemplary embodiment of the present invention as applied to exposure level stitching of patterns in a low contrast photosensitive layer or layers.

For some cases, the final developed photoresist pattern itself can serve as the actual nanostructured surface for replication. This is often the case for Motheye films, where interference lithography and a lower contrast resist will incur a more sinusoidal pattern to the developed features as shown in the Motheye structure of FIG. 1. In these cases, the photo bleaching effect of the photoresist is smaller, and self masking in the photoresist may be problematic, or otherwise impractical. For such low contrast photoresist applications, a contrast enhancing material (CEM) film can be applied on top of the photoresist. Such materials are available commercially from Shin-Etsu MicroSi™ and are specifically designed for "aerial" image (i.e. non-contact) exposure applications such as interference and projection lithography[12,13]. FIG. 7 is an illustration representing an exemplary embodiment of the modified stitch alignment invention using a contrast enhancing film 134 deposited on top of the photoresist 133 which is in turn deposited on a suitably transparent substrate 132. As shown in the figure, after the exposure stitching is complete, the CEM film is simply removed. The detailed explanation for FIG. 7 follows that for FIG. 5, with the exception that the resist development results in a sinusoidal like profile nanostructured surface 142, suitable for direct transfer to a master stamp. Typically, this transfer process entails deposition of a thin layer of metal, such as gold. Thick Nickel plating can then be used to build up a rigid over layer that can then be transferred to a rigid back plate. Photoresist stripping then yields the rugged Nickel "shim" negative of the original photoresist structure, which can then be used to mass replicate the nanotexture by any of various molding processes. Although targeted for stitching of exposure patterns in low contrast photoresists, such CEM films may be used to increase the self-masking alignment signal strength for any photoresist selection.

3. Processing of the Self Masking Alignment Feedback Signal

The previous section detailed how the photosensitive layer becomes an optical alignment mask for an adjacent exposure. This section will detail how this mask is used to perform the actual stitch alignment.

Figure 8:
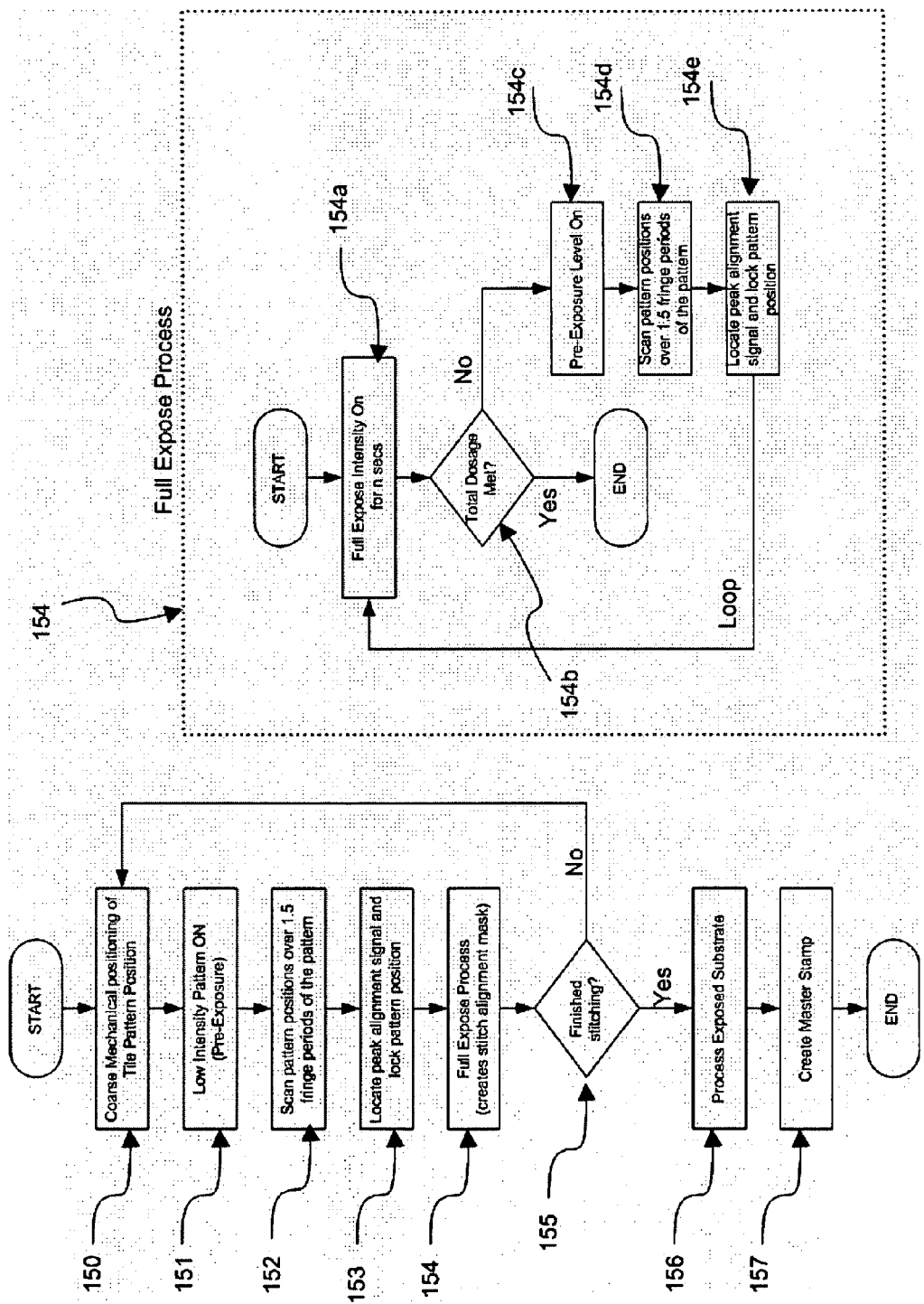
FIG. 8 is a flow diagram of the operation of a stitch alignment and exposure state machine in accordance with an exemplary embodiment of the present invention.

FIG. 8 features flow diagrams that illustrate processing of the optical alignment feedback signal in accordance with an exemplary embodiment of the present invention. In the figure, once the process is started, the relative coarse position of the substrate relative to the first exposure is set 150. The exposure level is switched on at a pre-exposure (alignment) level 151. The fine position of the pattern relative to the substrate is then dither scanned over distances suitable for ascertaining the position at peak feedback signal 152. Typically, this scan distance will be 1.5 times the period of the fine structure features so as to ensure capture of a significant portion of the feedback signal peak in the feedback time domain waveform. Once the maximum feedback signal is located, the position is locked to this condition 153. A full exposure process then takes place 154, which actually consists of a subroutine that periodically checks and corrects the alignment against thermal and other drifts during the course of the full exposure step 154. As shown in the figure, the full exposure starts with a full exposure energy and intensity level for a prescribed time "n" time in block 154a. The first time passing through the decision block 154b, the full exposure condition will typically not yet be met. The alignment is then checked and corrected as necessary in blocks 154c, 154d, and 154e. The process then loops back to the full exposure level for another time period "n" in block 154a. This looping will continue until the integrated dosage for full exposure has been met. Inputs to this block 154 include interval n as well as a loop count. The loop count is equal to the total dosage time for maximum exposure divided by the exposure time interval n.

A. The Alignment "Search" Window

At first look, the dose threshold behavior of FIG. 6 would seem to imply that there is a substantial window of time (dosage=intensity×time) to perform alignment. After all, typical photoresist exposure times for interference lithography are typically in the 30 to 60 second regime. By attenuating the UV source 10 dB during the alignment step, the window before threshold exposure occurs could be extended by 10 times to over 300 seconds (5 minutes). By using a lock-in amplifier to modulate and collect the alignment feedback signal, the duty cycle could also be used to directly reduce the average intensity of the beam during alignment. However, it is important to recognize that each overlap alignment area will undergo pre-exposure dithering at least twice: once before it is first fully exposed, and again for the adjacent exposure. Thus, the actual time window to perform alignment is half what is indicated by the photoresist contrast curve.

B. Transmission "Leakage" and Position Search "Dithering"

Figure 9:
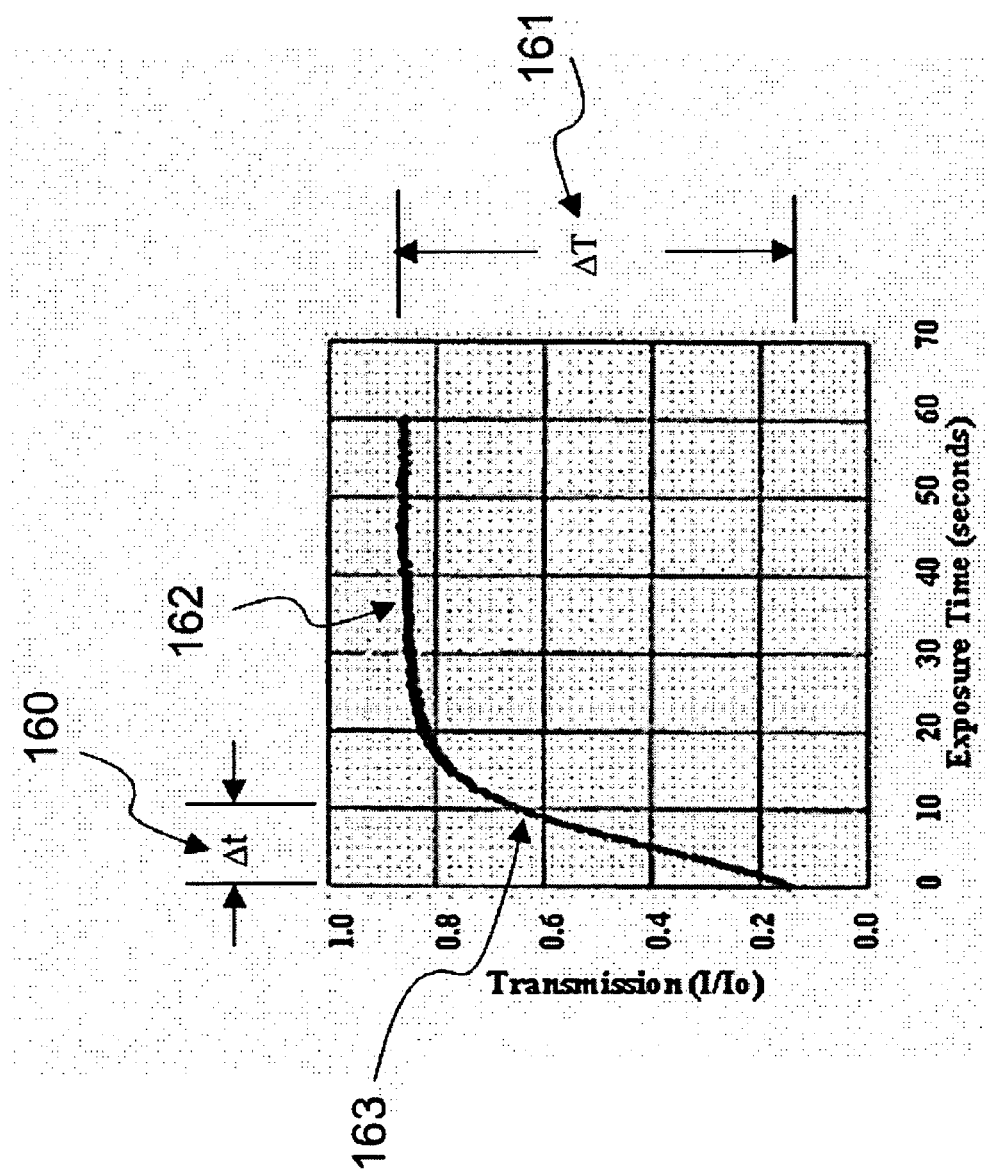
FIG. 9 is a graphical representation of an example of the optical transmission behavior of a typical photoresist as it undergoes full fluence from an exposure source.

It is important to understand that under any exposure level, as long as the photon energy is sufficient, then there will be some bleaching of the resist. The rate of bleaching will be determined by the exposure wavelength and intensity. The bleaching depth profile at a specific intensity, photon energy, and time will depend on the specific resist being used. The net effect is that a typical photoresist film will continuously increase in transmission during any level of exposure. A sample of a common photoresist film (AZ1350) transmission increasing over time under full exposure conditions is given in FIG. 9. The high slope region 160 of the curve 162 represents the approximate pre-exposure time window Δt whereby the dosage has not yet reached the Eo threshold value indicated in FIG. 6. This slope and saturation of transmission over exposure time eventually results in the ΔT total change in transmission 161. It is apparent that even a low average intensity pre-exposure transmission stitch alignment signal will change with time due to this steady "leakage" exposure within the dosage window 160. The significance of this is that the optical alignment feedback loop will need to be capable of masking out this leakage and drift component.

In an exemplary embodiment of the present invention, a simple way to mask the transmission leakage signal is implemented by "AC coupling" the transmission signal beyond the maximum transmission leakage ramp rate. Dithering of pattern position at a higher frequency is done to search for the aligned position. The AC coupling is configured to filter out just the dither frequency components in the transmission signal. Peaks in the transmission vs. position sweep represent alignment along the dithering position axis. If a 2-D pattern must be aligned, both x and y will be dithered sequentially and iteratively to get maximum alignment. If necessary, another alignment axis may be theta or rotation of the pattern. All axes need to be aligned sequentially and iteratively to achieve the optimal alignment for all overlap regions and thus seamless tiling of the patterns.

C. Alignment Mechanism and Procedure

Up to now, it has been taken for granted that position of the substrate relative to the exposure pattern (or vice versa) can be freely and smoothly controlled, and is stable during the full exposure step. In fact, when feature spacings are on order of 100 nm, and tolerances are in the 5 to 10 nm regime, this is not a trivial task.

As illustrated in the preferred embodiment of feedback processing in FIG. 8, a coarse positioning mechanical stage steps the substrate (recording plane) to the approximate step and repeat pattern stitch positions. Then, a fine high speed positioning control is dithered to locate and lock the pre-exposure pattern to the previous exposed pattern in the overlap region. The fine "nano" positioning travel only need be in the range of the feature period itself in order to be able lock an adjacent pre-exposure pattern to an exposed (self-mask) pattern. Dithering position over two or more feature periods will ensure that an entire transmission maximum will be captured during any sweep.

Figure 10:
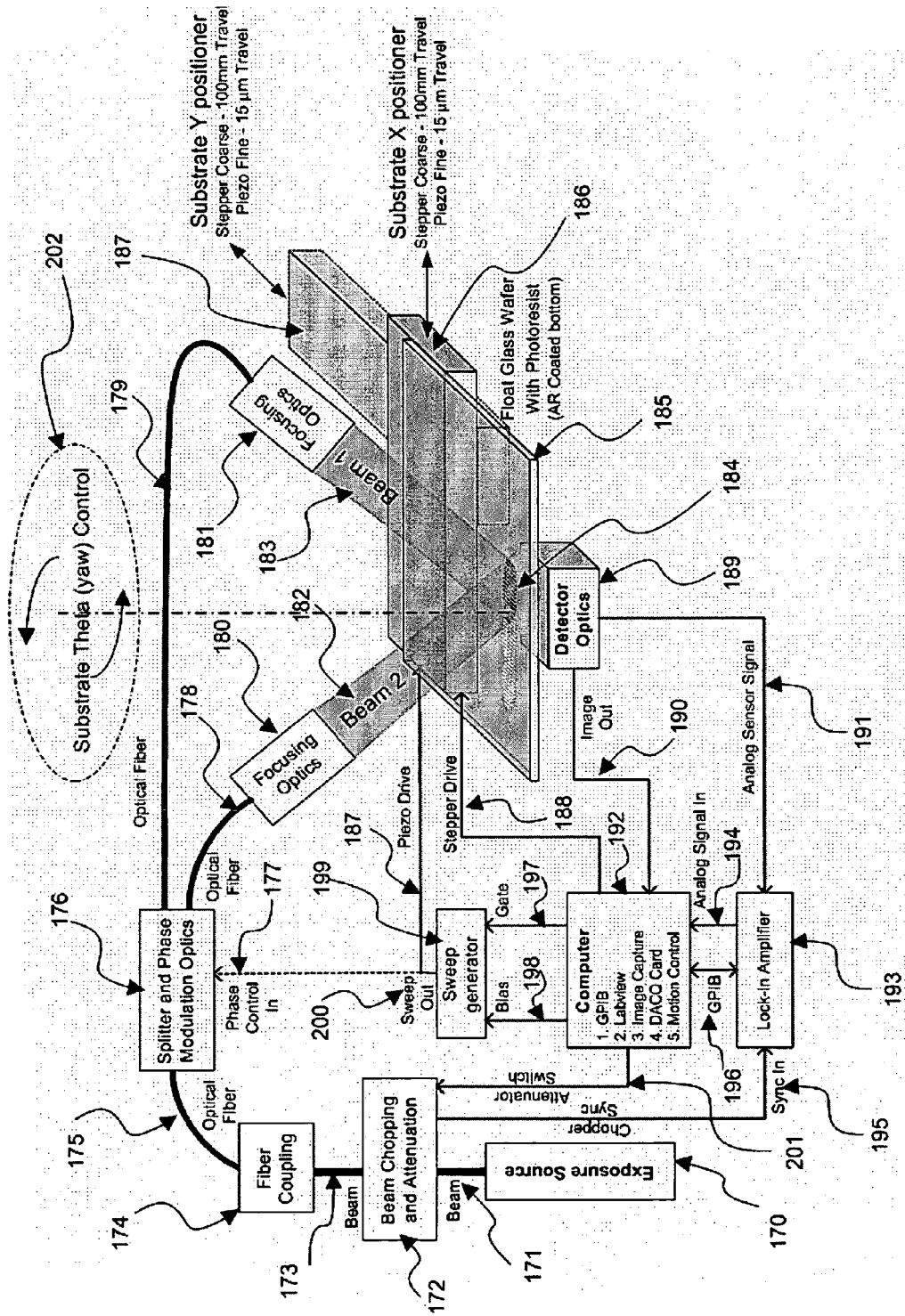
FIG. 10 is a diagram of a complete tile and stitch alignment and exposure machine implemented for stitching patterns formed by two beam interference lithography in an exemplary embodiment of the present invention.

FIG. 10 illustrates an exemplary embodiment of the present invention when applied to stitching of linear grating fringe patterns formed by two beam interference lithography. In the figure, the exposure source radiation from 170 is coupled into single mode polarization preserving optical fiber 175 by 174 after being processed by the beam chopping and attenuation unit 172. The beam chopping is engaged during lock-in amplifier operation to reduce feedback signal noise stemming both from ambient light and from the transmission photo-detector and sensor electronics. The attenuation function controls the beam intensity for switching from pre-exposure to full exposure intensity conditions. Once the radiation is in the optical fiber 175, it is inserted into a fiber optic splitter and differential phase controller 176. This unit splits the light into two beams, and a phase control signal is applied to adjust and lock the relative optical phase between the two beams. This differential phase controls the spatial phase of the fine pattern features in interference pattern 184. The two beams are then delivered over single mode optical fibers 178 and 179 to the collimating or focusing optics 180 and 181. The single mode optical fibers 178 and 179 result in high quality single mode Gaussian beams being delivered to the recording (wafer) plane 185 via suitable high quality collimating optics 180 and 181. Beam shaping optics may be integrated into 180 and 181, provided the interference pattern 184 is still regular and periodic enough to allow seamless (or near seamless) overlap in the tile overlap regions. In a preferred embodiment of the present invention, collimating optics 180 and 181 are designed and positioned to achieve cylindrical beam waists at the interference pattern 184 in recording surface 185. This will give a uniform and well defined wave front intensity and phase over a well defined elliptically shaped exposure interference pattern 184 for both beams. Both beams 182 and 183 can then completely overlap. This is important for achieving homogenous interference patterns 184 that can thus be stitch tiled by the present invention.

As shown in FIG. 10, one of two high speed fine position adjustment mechanisms are used during the stitch alignment positioning (dithering) step. The piezo translation control 187 is well known and serves as the conventional mechanical approach. The optical phase control 177 is unique to interference lithography in that the differential phase between the two beams can be controlled to adjust the fringe period positions. Differential phase sweep (dithering) over 180 degrees or more will ensure capture of the maximum alignment feedback signal during the fine position scanning sweep. Ability to control phase over at least 270 degrees will ensure that the alignment peak transmission can be set to the center of the 180 degree phase control sweep through DC bias offset control level.

The operation of the exemplary embodiment of the present invention illustrated in FIG. 10 is based on the feedback signal processing embodiment described in FIG. 8. The computer 192 represents the sequential state machine that enables automation of the tile stitch align and repeat process of FIG. 8. Computer 192 processes the transmission stitch alignment feedback image signal 190 directly and analog sensor signal 191 via lock-in amplifier output 194 or via digital interface 196 such as by general purpose interface buss (GPIB).

The detailed operation steps are as follows:

1. For the first exposure, since there is no other pattern to lock on to, the only requirement is that exposure pattern 184 must be relatively stable enough to generate a "seed" transmission alignment mask pattern. Even if the feature contrast is lower for this first exposure, adjacent stitched patterns will quickly improve, as they are phase locked on to previous exposures.

2. The beam 171 is then blocked or sufficiently attenuated by 192 via control 201 of attenuator 172 after each full exposure step before indexing to the next tile position.

3. The mechanical stages 185 and 187 are controlled by computer 192 stepper control 188 of x and y coarse position of recording plane 185 for the next exposure pattern to be tile stitched.

4. The pre-exposure intensity level is engaged via computer 192 control 201 of attenuator 172. Computer 192 enables lock-in amplifier 193 via digital interface 196 to lock on to analog optical transmission signal 191 modulated by beam modulation in 172 and sensed by sensor 189.

5. The fine nanometer scale position adjustment (piezo 187 or optical phase 177) is then dithered (scanned) by computer 192 control 197 of the gate of sweep generator 199.

6. Computer 192 captures analog signal 191 over dither scan window time via analog output 194 or digital interface 196 from lock-in amplifier 193. The captured waveform is used to locate and lock the pre-exposure pattern 184 fringe phase (by phase control 177) or table position (by piezo control 187 of mechanical stages 186 and 187) to the alignment position indicated by the feedback signal 191 peak level position. This bias level is set by the computer 192 via bias control 198 of sweep generator 199. Note that fine position bias levels for x 186, y 187, and theta 202 (if applicable) axes are iteratively aligned until the absolute maximum feedback signal is achieved. In these cases, a plurality of bias 198, sweep gate control 197 must be implemented to accommodate the plurality of alignment axes. In the two beam interference embodiment of FIG. 10, since the interference pattern 184 is a linear grating pattern oriented in line with the y axis, the single x axis fine alignment is sufficient provided the yaw or linearity of the x and y stages over their translation ranges meets a prescribed tolerance.

7. The dither sweep is then switched off by computer 192 via gate control 197 of sweep generator 199. The bias level control 198 level set in step 6 is maintained by computer 192 to maintain the current stitch aligned condition.

8. The computer 192 switches the attenuator 172 to full exposure condition via control 201.

9. As full exposure proceeds, the fine alignment is periodically checked and corrected to guard against any thermal induced or other position drifts that could smear the stitched pattern. Steps 4 through 8 are repeated for each alignment check until full exposure dosage occurs. Note that alignment may also be checked under full exposure conditions if the alignment check process is rapid enough.

10. Go to step 2 and repeat until all patterns are stitched

Figure 11:
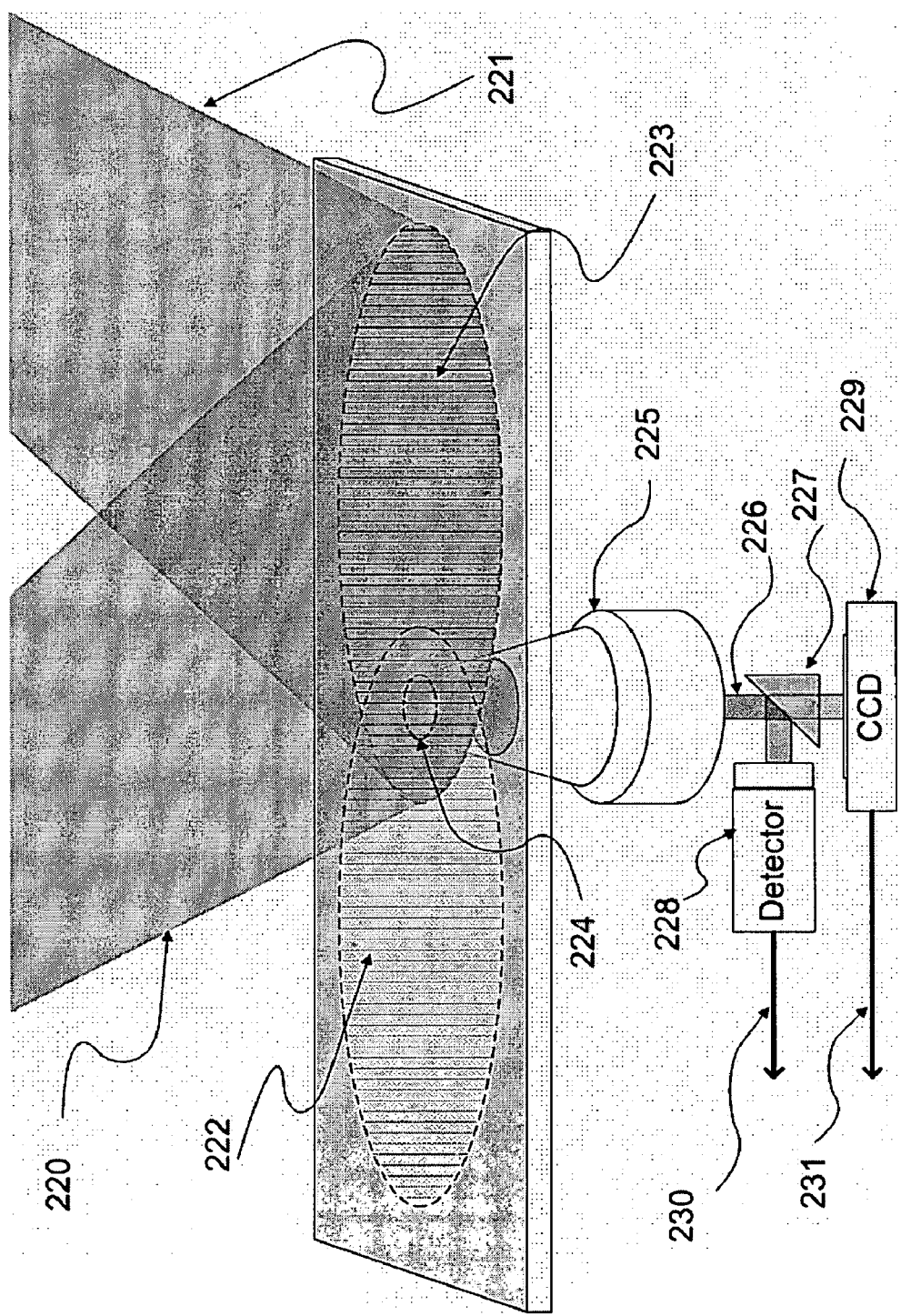
FIG. 11 is a detailed diagram of an embodiment of an optical transmission signal sensor apparatus in accordance with the machine of FIG. 10.
Figure 14:
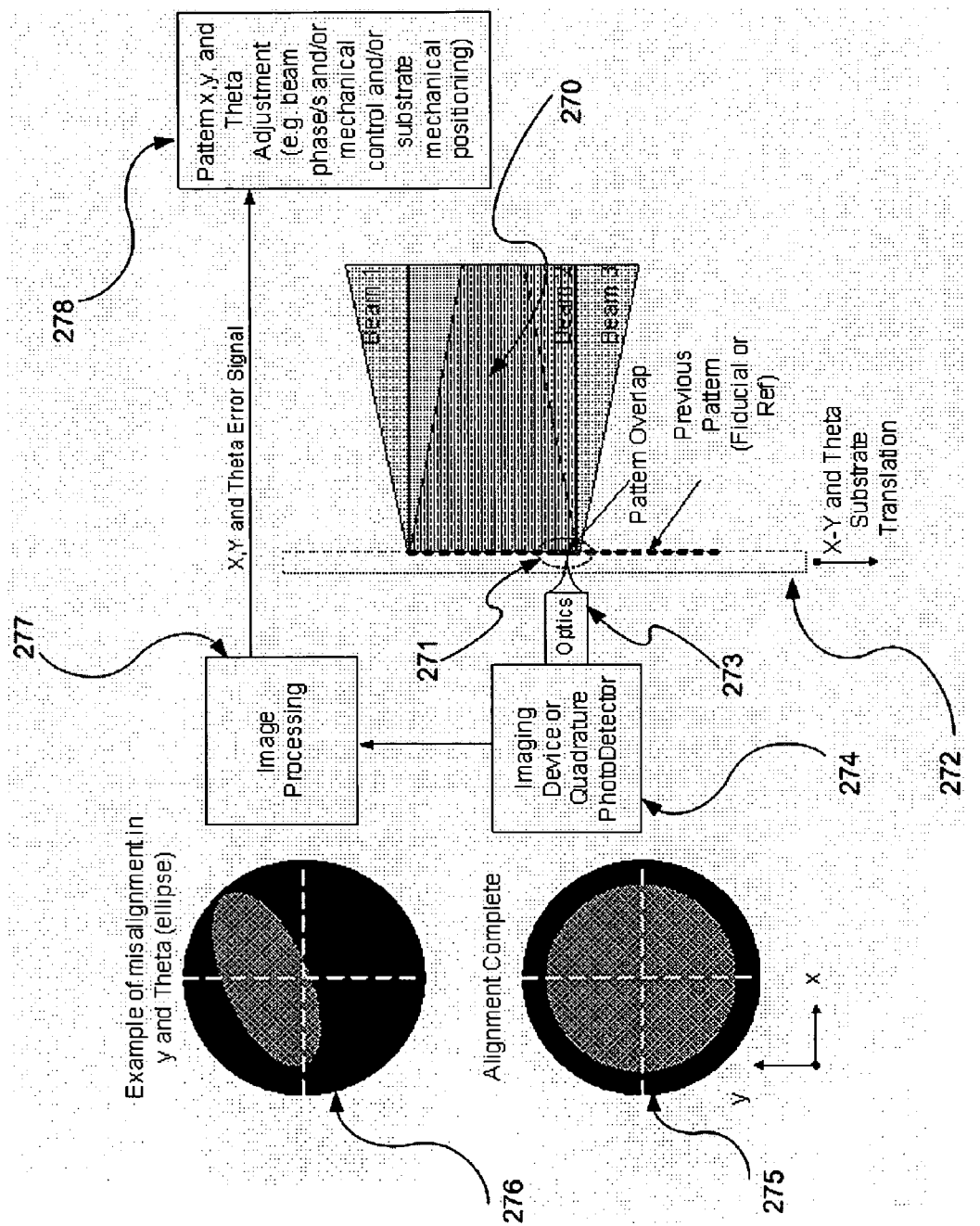
FIG. 14 illustrates an example of the use of the transmitted alignment signal image map to achieve bipolar servo control for rapid or continuous stitch alignment before or during full exposure conditions.

FIG. 11 illustrates a preferred embodiment of the alignment sensor feedback unit 189 for the present invention. Here, the sensor optics consists of an objective lens 225 aligned to image a small circular region 224 of the recording plane within the stitch alignment (overlap) region of post exposure pattern 222 and the current pre-exposure pattern 223. An "f-stop" may be used to capture only light within a specific cone angle from this circular region. Note that the objective lens 225 need not be capable of resolving the fine structure of the interference pattern, only the overall intensity map and level. A beam splitting prism 227 or other beam splitting device is then used to split off a portion of the imaged intensity profile 226 for high sensitivity analog transmission feedback signal sensing using a photo-detector 228. The remaining portion passes through prism 227 to fall on an imaging device 229, such as a CCD camera. The imaging device 229 captures the relative intensity map while detector 228 more accurately captures the total transmitted optical power. In an exemplary embodiment of the present invention, this image information is used to determine the stitch position error sign so as to generate a true bipolar servo stitch alignment feedback signal. This embodiment is illustrated in FIG. 14. In the figure, a plurality of monochromatic beams 270 is used to create the interference pattern 271 on the substrate recording plane 272. Imaging the optical transmission of the pattern in the overlap region by an objective lens 273 will result in various intensity map profiles depending on the degree of stitch or mesh alignment along linear 186 and 187 and angular (yaw) 202 axes of FIG. 10. The figure presents examples of image profiles for a misaligned case 276 and for a properly stitch aligned case 275 along all axes. Image processing 277 and pattern or substrate control 278 is implemented in the computer 192 of FIG. 10. With such a more direct stitch alignment feedback, alignments can be completed more rapidly than with the analog dither approach described in previous embodiments. This alignment can also be checked and corrected under full exposure conditions. In such a case, an attenuator or other gain control of the imaging device may be implemented to avoid image saturation effects.

It will be obvious to those skilled in the art that the transmitted image processing approach just described for determining stitch alignment error polarity can be readily extended to reflected image processing, given a suitably reflecting substrate. These, and other modifications like it, may be employed without violating the spirit of this invention.

Figure 12:
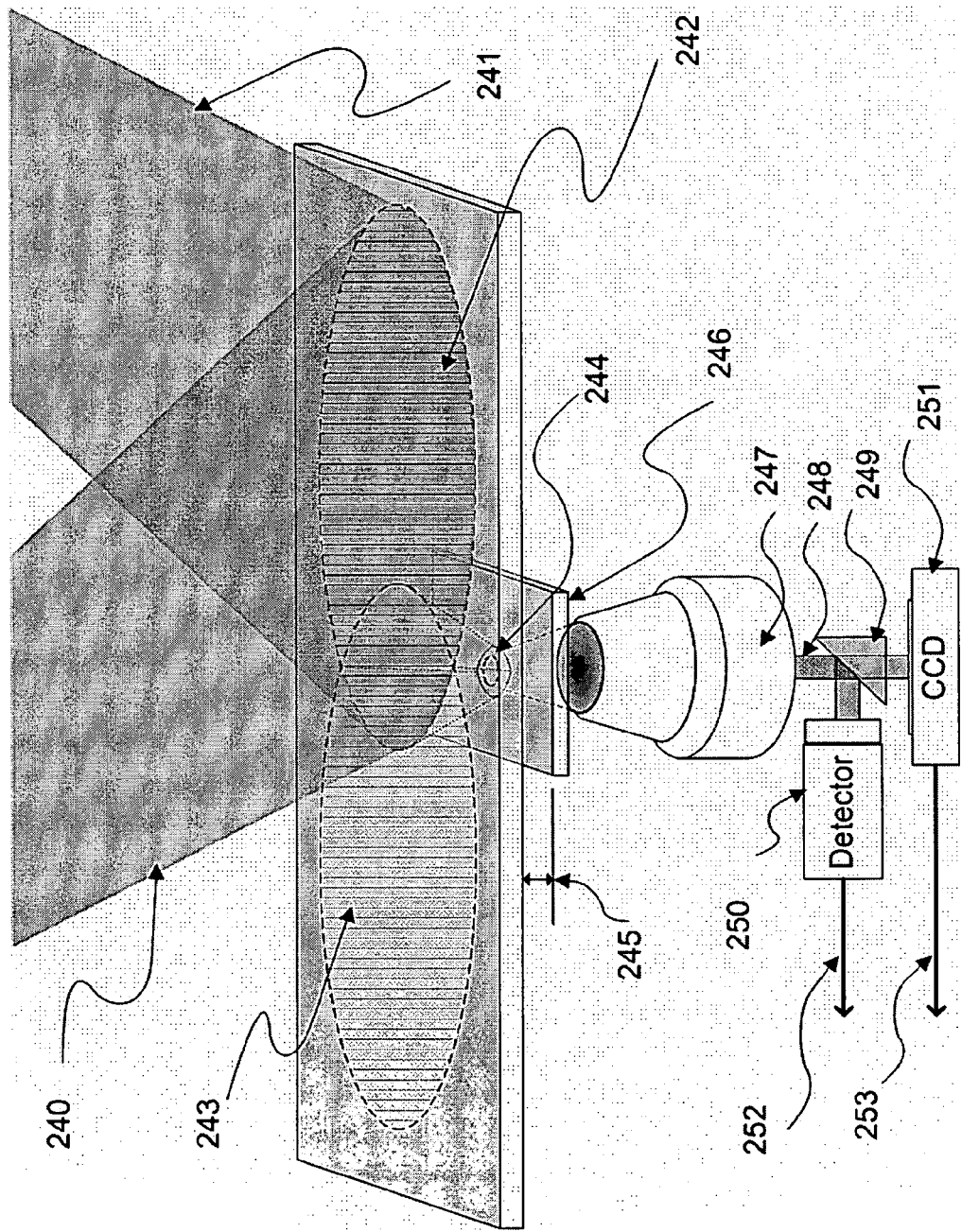
FIG. 12 is a detailed diagram of an exemplary embodiment of the transmission signal sensor apparatus in accordance with the machine of FIG. 10, whereby a secondary image registration layer is implemented to confine the transmission signal to a well defined plane.
Figure 13:
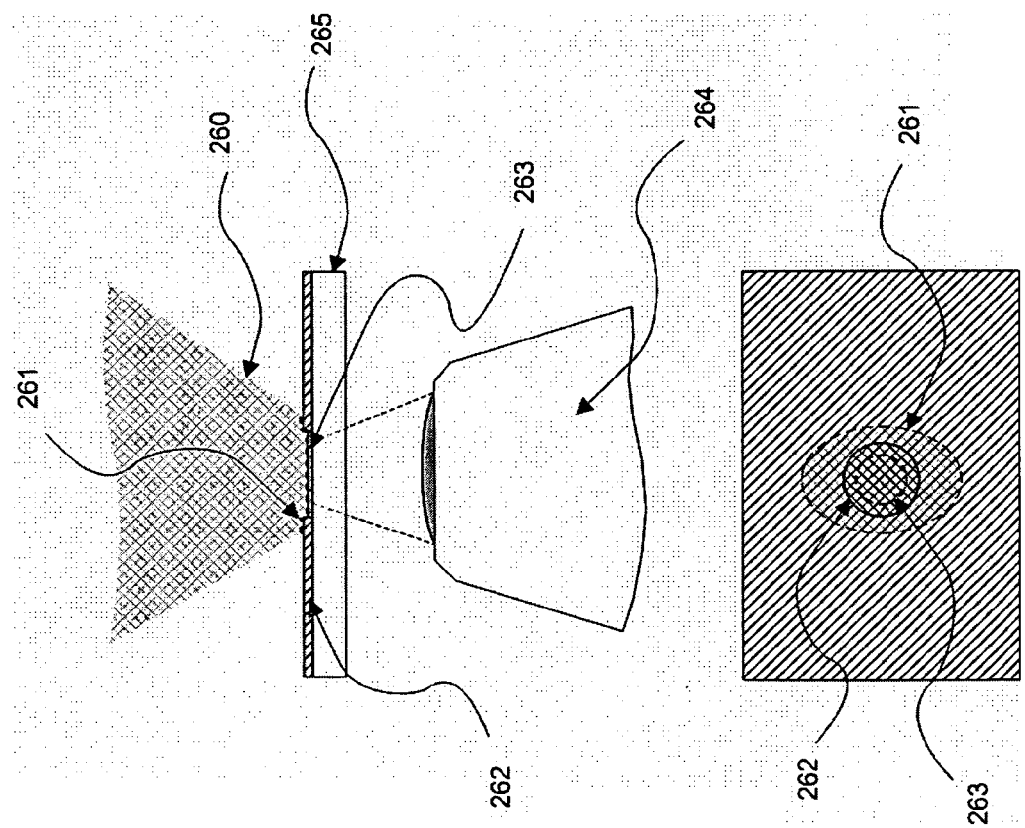
FIG. 13 is a detailed diagram of the secondary image registration layer referred to in FIG. 12.

In a preferred embodiment in accordance with the present invention, a secondary image registration plane, such as consisting of a transparent slide with a frosted surface, or other image plane registration device may be used in place of direct imaging of the overlap regions in the substrate recording plane. Such a modification can alleviate interference and "speckle" effects in the transmitted optical intensity map, and can lead to a more consistent stitch alignment signal reading. FIG. 12 illustrates an exemplary embodiment of such a registration plane in accordance with the present invention. Here, all components common to the configuration of FIG. 11 serve the same functions. The difference is that the objective lens 247 in this case is chosen to image a region of the secondary image registration plane 246 spaced at some distance 245 from the primary recording plane containing impressed post exposure pattern 243 and pre-exposure pattern 242. Item FIG. 13 is a more detailed illustration of this secondary recording plane in accordance with an exemplary embodiment of the present invention. Here, 265 of FIG. 13 represent detail of the secondary image registration plane 246 of FIG. 12. In FIG. 13, the image registration plane 265 has upon it a spatial optical filter or other f-stop device so as to limit the registered image to an aperture 262 that only contains interference pattern light 261 from interference volume 260. Objective lens 264 is chosen and positioned so as to image a smaller aperture field 263 of this overall interference pattern contained within the spatial filter aperture 262.

It will be obvious to those skilled in the art that a general plurality of interfering beams may be employed to generate the interference patterns referred to in all the embodiments described thus far and to the invention illustrated by FIG. 10. The description thus far is to serve as an exemplary example of overlap stitch alignment of interference patterns. For a plurality of beams beyond the two described here, a corresponding plurality of beam controls is implied without violating the spirit of this invention.

It will also be obvious to those skilled in the art that although the embodiments described thus far apply directly to the field of interference lithography, other pattern impression mechanisms may also be employed without violating the spirit of this invention. These include, but are not limited to, electron beam, x-ray, radio, or any other radiation source that is used to generate a pattern that is to be tiled and stitch aligned.

It will also be obvious to those skilled in the art that the transmission feedback signal described thus far for the present invention can be extended to include other stitch alignment signals, including, but not limited to, reflection or diffraction, without violating the spirit of the present invention.

A fundamental aspect of the present invention is that each pattern impression, by itself, creates a stitch alignment fiducial or reference for subsequent pattern impressions. In this way, stitch errors are minimized relative to approaches that use a separate external reference. In this respect, there is no restriction on the overlap condition. In the embodiments described in the present disclosure, the overlap condition has been preferred so as to directly align a new pattern to a previously impressed one through transmission signal feedback. However, other schemes may be devised to reduce this overlap to zero, given suitable intensity profiles, while still referencing off of previous impressions to perform the alignment. In this respect, such zero, or even negative overlap configurations, may be implemented without violating the spirit of this invention.

It is the intention of this disclosure to describe preferred and exemplary embodiments of the present invention. This does in no way exclude other modifications and embodiments to the present invention that that do not violate the spirit of this invention.

What is claimed is:

1. A method for stitch alignment, tiling and printing of patterns on a substrate, the method comprising:
   (a) providing a substrate wherein the substrate has a photosensitive surface capable of exhibiting a photo bleaching effect;
   (b) positioning the substrate such that an original position of the substrate is established;
   (c) creating a first pattern at a first region of the substrate by image exposure by radiation onto the photosensitive surface of a selected region of the substrate surface wherein the first pattern creates a post-exposure impression of the first pattern in the form of bleaching and thereby creating a reflection or transmission mask in the photosensitive surface;

(d) positioning the substrate such that a second position of the substrate is established for forming a second pattern at a second region of the substrate substantially adjacent to the first pattern wherein the second pattern creates a pre-exposure pattern of the second pattern on the photosensitive surface forming a partially overlapping region between the post-exposure impression of the first pattern and the pre-exposure pattern of the second pattern;

(e) measuring reflected or transmitted radiation of the post-exposure impression of the first pattern and the pre-exposure pattern of the second pattern within one or more overlapping regions, wherein the radiation reflection or transmission is measured by one or more photodetectors;

(f) determining the degree of stitch alignment between the post-exposure impression of the first pattern and the pre-exposure pattern of the second pattern within one or more overlapping regions;

(g) adjusting the alignment based on the measured intensity of the reflected radiation, transmitted radiation or both until new images of the first and second regions are aligned using the post-exposure impression as a relative position reference;

wherein the post exposures create base patterns at a plurality of partially overlapping tiled positions.

2. The method according to claim 1, wherein the patterns are formed by interference lithography using a plurality of monochromatic exposure beams to create the interference pattern on the substrate recording plane.

3. The method according to claim 2, wherein the exposure source radiation is provided in single mode Gaussian beams delivered by collimating optics means.

4. The method according to claim 3, wherein the exposure source radiation comprises collimating optics positioned to achieve cylindrical beam waists at the interference pattern on the substrate surface.

5. The method according to claim 2, wherein the bleaching effect of the photosensitive layer forms a stitch alignment mask used to register the post exposure pattern position relative to the new exposure pattern position and wherein the degree of stitch alignment is by imaging of the pattern overlap region.

6. The method according to claim 5, further comprising relative positioning of the substrate or pattern to the relative peak change in reflected or transmitted light in order to stitch align the adjacent pre-exposure pattern with a post exposure pattern.

7. The method according to claim 6, wherein the method further comprises using a multi-beam interference fringe pattern, wherein the phase of at least one radiation beam is modulated in order to align the spatial phase of the fringes.

8. The method according to claim 6, wherein the movable stage comprises a coarse adjusting stage that holds the substrate, and one or more fine adjustment positioners which provide for fine XY and tilt/rotation movement.

9. The method according to claim 8, wherein the method further comprises fine stitch alignment using optical modulation.

10. The method according to claim 6, wherein mask is a permanent effect in the exposed surface.

11. The method according to claim 6, wherein the mask is a semi-permanent effect in the exposed surface.

12. The method according to claim 11, wherein the method further comprises alignment feedback between pre and post exposures and the pre-exposure pattern is tiled by overlapping and meshing with post-exposure patterns using an alignment error feedback signal.

13. The method according to claim 12, wherein the overall exposure pattern intensity profile is modified at the boundaries where stitching overlap occurs so as to ensure a more spatially uniform exposure dosage.

14. The method according to claim 13, wherein the photosensitive surface comprises a photoresist layer.

15. The method according to claim 13, wherein the photoresist undergoes a permanent change after exposure.

16. The method according to claim 13, wherein the photoresist is a positive photoresist which provides higher photoresist optical transmission after exposure.

17. The method according to claim 13, wherein one or more photoresist layers is applied to an optically transparent substrate and the post exposure pattern results in higher optical transmission.

18. The method according to claim 13, wherein the substrate further comprises a high contrast photoresist.

19. The method according to claim 13, wherein the aligned position is determined by dithering of the relative pattern position by fine high speed positioning control capable of determining the optimal alignment for overlap regions of the patterns to locate and lock the pre-exposure pattern to the previous exposed pattern in the overlap region.

* * * * *